US 6,492,797 B1

(12) United States Patent
Maassen et al.

(10) Patent No.: US 6,492,797 B1
(45) Date of Patent: Dec. 10, 2002

(54) SOCKET CALIBRATION METHOD AND APPARATUS

(75) Inventors: Howard M. Maassen, San Jose, CA (US); William A. Fritzsche, Morgan Hill, CA (US); Thomas P. Ho, Los Altos, CA (US); Joseph C. Helland, San Jose, CA (US)

(73) Assignee: Schlumberger Technologies, Inc., San Jose, CA (US)

(*) Notice: Subject to any disclaimer, the term of this patent is extended or adjusted under 35 U.S.C. 154(b) by 0 days.

(21) Appl. No.: 09/514,708

(22) Filed: Feb. 28, 2000

(51) Int. Cl.[7] ............................................. G01R 11/32
(52) U.S. Cl. ....................................................... 324/74
(58) Field of Search .......................... 324/74, 755, 763, 324/765; 702/79, 89, 106, 118, 120, 125, 126; 714/700, 726, 731, 733, 734; 327/72, 74, 77

(56) References Cited

U.S. PATENT DOCUMENTS 5,262,716 A * 11/1993 Gregory et al. .......... 324/158 F
6,133,725 A * 10/2000 Bowhers ................... 324/158.1
6,298,465 B1 * 10/2001 Klotchkov .................... 714/814
6,324,485 B1 * 11/2001 Ellis ............................. 702/117

* cited by examiner

Primary Examiner—N. Le
Assistant Examiner—Etienne P LeRoux
(74) Attorney, Agent, or Firm—Skjerven Morrill LLP; Norman R. Klivans (57) ABSTRACT

A method and apparatus for calibrating tester timing accuracy during testing of integrated circuits. An ATE tester measures itself through reference blocks that have the same relevant dimensions as the integrated circuits to be tested. The number of reference blocks required is equal to the number of signal terminals on an integrated circuit to be tested being subject to timing calibration. A signal trace electrically connects a different signal terminal to a common reference terminal on each reference block. Each signal trace used should be closely matched both physically and electrically to the other signal traces used in the set of reference blocks, so that the electrical path length associated with each trace is nearly identical. To perform the timing calibration, the reference blocks may be mounted on a single fixture one at a time, or using multi-site fixtures, multiple reference blocks may be used in parallel. The fixture provides electrical connection of the reference block to the loadboard, and ultimately, the tester.

13 Claims, 5 Drawing Sheets

SOCKET CALIBRATION METHOD AND APPARATUS

FIELD OF THE INVENTION

This invention relates to calibrating timing on a tester which tests integrated circuits.

BACKGROUND

This invention relates to calibrating automatic test systems for testing integrated circuits. Automated test equipment (ATE) is used to simulate the operating conditions that an integrated circuit will experience when used in an application. An integrated circuit undergoing testing is also known as a device under test (DUT).

The ATE is controlled by a computer which executes a set of instructions (the test program). The ATE must present the correct voltages, currents, timings and functional states to the DUT and monitors the response from the device for each test. The ATE then compares the result of each test to pre-defined limits and a pass/fail decision is made.

Figure 1:
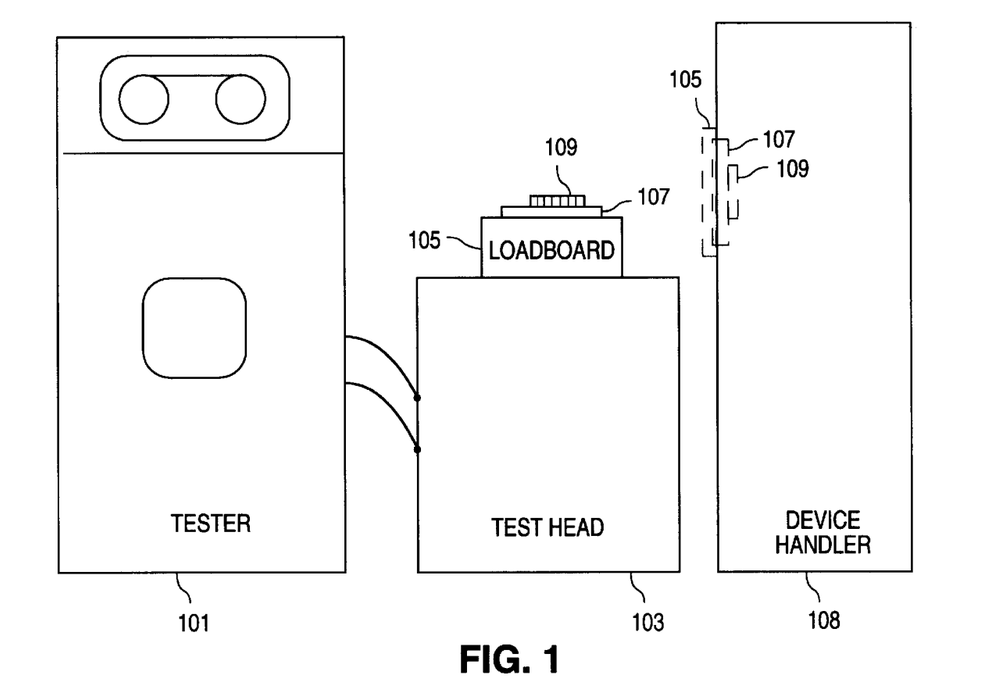
FIG. 1 shows the typical equipment used in conjunction with the invention.

FIG. 1 depicts a typical environment in which integrated circuits are tested. A tester (ATE) 101 which contains the test program, memory, pattern generators and other circuitry, is electrically coupled to the test head 103, which contains the circuitry to supply input signals to the DUT 109 and to receive output signals from the DUT 109. A device handler 108 is often used to automate handling of DUTs to be tested, increasing throughput.

Timing calibration refers to correcting for time delays in routing a signal from the tester to a DUT (or conversely, from a DUT to the tester) due to constraints present in the testing equipment. Thus, it is essentially a software correction for a hardware-based error. These time delays are due to, among other things, the several layers of interconnect between the tester and the DUT, as shown in FIG. 1. For example, if a test engineer desired to supply a signal to a DUT at a time value of 4 nanoseconds (ns) after the start of the test program, then he/she would need to take into account the electrical path lengths between the tester 101 and test head 103, between the test head 103 and the loadboard 105, between the loadboard 105 and the fixture 107, and finally, between the fixture 107 and the DUT 109 as effecting the required travel time for the signal. Thus, the instruction from the tester to supply a signal to the DUT must be earlier in time than 4 ns after the start of the test program. Obviously, as the number of bits of data transferred per second on an electrical path or wire (transfer rate) increases, it becomes more difficult to determine if the DUT meets its performance specifications, due to tighter timing tolerances. In another test equipment configuration, the loadboard 105, fixture 107 and DUT 109 mate with the device (DUT) handler 108 (as shown in dashed outline) to facilitate more rapid testing of a large number of devices One method of timing calibration currently practiced in the ATE industry uses an intended DUT. The intended DUT is inserted into a fixture. A pulse is programmed on a driver circuit of the tester and a comparator is used to measure when the resulting pulse occurs at a selected reference terminal of the DUT to obtain the timing offset that occurs while comparing with the common reference terminal. Then a pulse is programmed on the reference terminal of the DUT and a comparator circuit on the tester is used to measure when the resulting pulse occurs at the tester to obtain the timing offset that occurs while driving with the reference terminal. The timing offsets are then adjusted to match previously measured timing data obtained from another tester on this DUT. However, this method of tester timing calibration has two significant disadvantages. First, the method requires having measured timing data from another tester (and this tester itself must be calibrated to some specific standard, not a device). Secondly, the method incorrectly assumes that device performance characteristics are constant over time, and are unaffected by minor changes in operating environment (e.g., temperature, power supply voltage, load impedance).

Figure 2A:
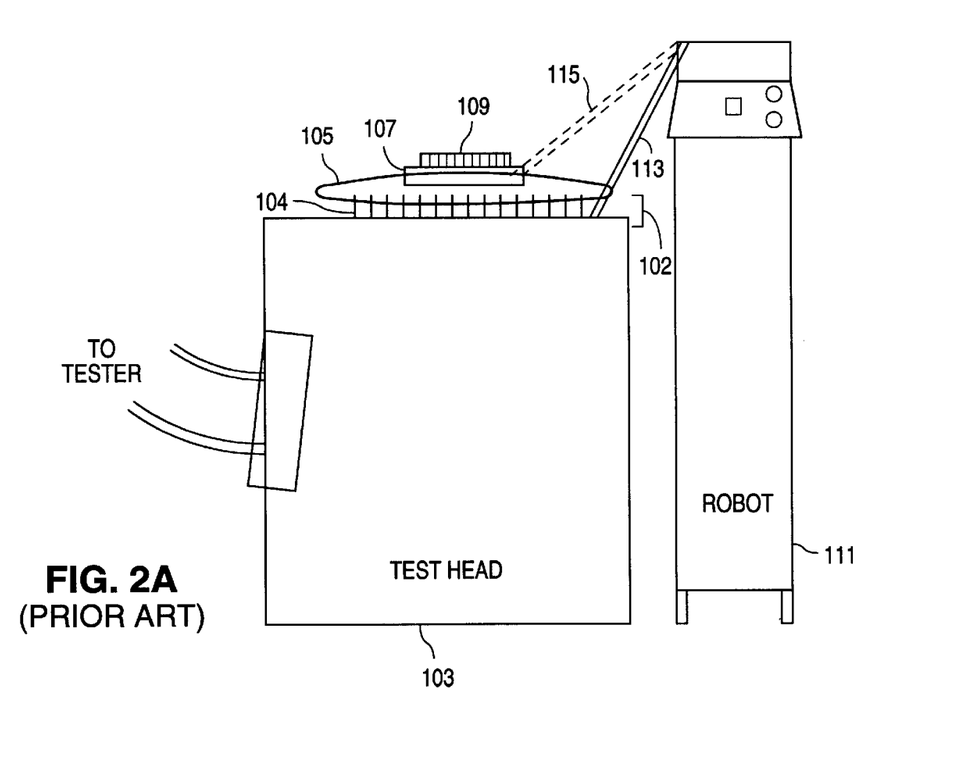
FIGS. 2A and 2B show calibrating tester timing accuracy according to the prior art.

FIG. 2A shows how robots are currently used in the ATE industry to make contact with the electrical connections 104 mating the test head 103 to the loadboard 105 (known as "pogo pins") to measure the associated path length. However, as a result of practicing this method, tester timing accuracy can only be specified to the level of the loadboard/test head interface 102—the electrical path length through the loadboard 105 to the fixture 107 holding the DUT 109 remains unaccounted for. Alternately, a robot 111 may be used which can make contacts at the fixture level (see alternate position 115 of robot arm 113, represented by a dashed line), but these robots are often slow, because the robot arm has to pick up and move between each fixture (when multiple parts are tested simultaneously in multiple fixtures). Time is also lost when using the robot because the test head must be dismounted from the handler, the robot attached, measurements made, and then the handler must be remounted before being able to test parts. Moreover, the robot has many precision mechanical parts, so it is subject to frequent breakdowns without expensive maintenance. Faster robots are also very expensive.

Figure 2B:
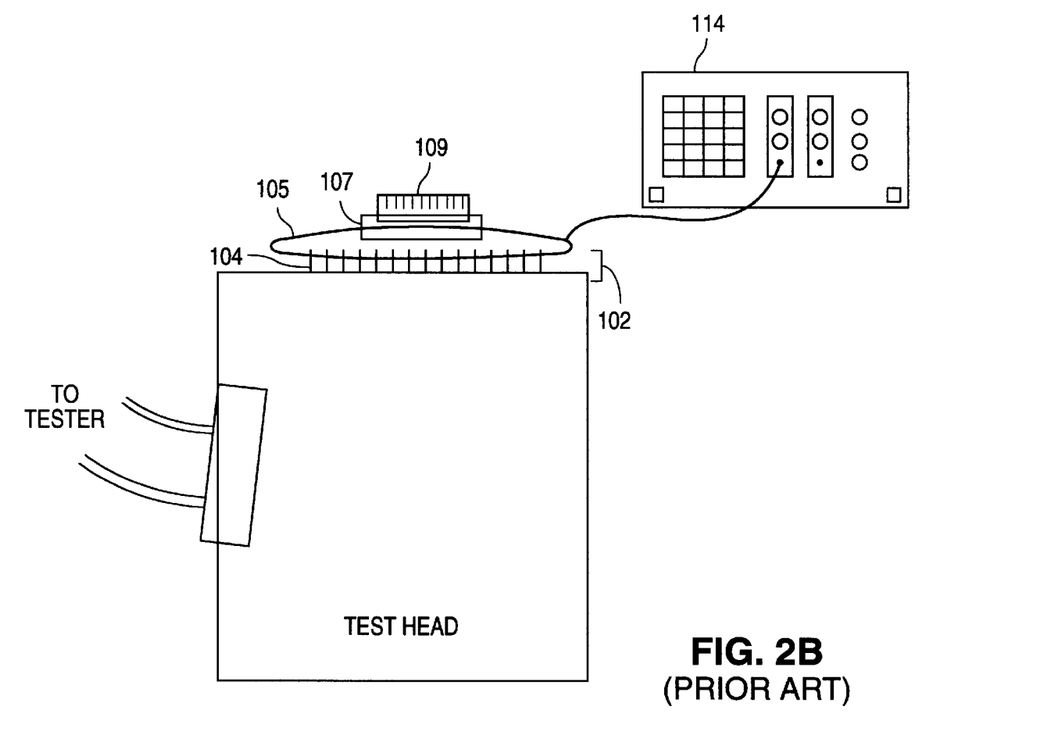

FIG. 2B shows the use of time domain reflectometry (TDR) as a method currently used in the ATE industry to measure the electrical path length 112 from the pogo pins (connecting the test head 103 to the loadboard 105) up to the fixture 107. This could be done with an oscilloscope 114, but the tester itself could also be used. However, this method assumes that there is very accurate measurement of the electrical path length up to the pogo pins. Any error here is compounded by the measurement of the electrical path length from the pogo pins to the fixture. Moreover, the accuracy of TDR measurements is on the order of +/−50 picoseconds (ps) using the tester. The accuracy of TDR measurements is improved (on the order of +/−15 ps) using an oscilloscope. However, even this accuracy is insufficient as it represents too much of the total error budget in testing high performance integrated circuits. Therefore, there remains a need for more accurate timer testing calibration for high performance circuits.

SUMMARY

The present invention is directed to a method and apparatus for calibrating tester timing accuracy, and the method and apparatus are particularly well-suited for testing integrated circuits that have a small number of high performance (high-speed) terminals, such as the 64/72-Mbit Direct Rambus DRAMs which operate at 800 MHz transfer rates, but have only 30 high speed signal terminals. The tester itself conventionally tests integrated circuits to determine if they meet performance specifications. According to the present invention, for calibration, the tester measures its own properties using reference blocks that are fabricated in relevant respects to be as similar as possible to the integrated circuits that are to be tested. For example, the reference blocks have the same relevant external dimensions as the integrated circuits to be tested, the same electrical connections, and the signal terminals in the same locations.

To practice the present method, a set of reference blocks is fabricated. The number of reference blocks required is equal to the number of signal terminals being subject to timing calibration on the DUT. A signal trace electrically connects a different signal terminal to a common reference terminal on each reference block in the set. To perform the timing calibration, the reference blocks may be mounted on a single fixture one at a time, or using multi-site fixtures, multiple reference blocks may be used in parallel. The fixture provides electrical connection of the reference block to the loadboard, and ultimately, the tester.

The tester then programs a pulse on the signal terminal of the reference block, and measures the amount of time that elapses until the resulting pulse occurs on the reference terminal of the reference block. Polarity is then reversed, and the tester programs a pulse on the reference terminal of the reference block. The tester then measures the amount of time that elapses until the resulting pulse occurs on the signal terminal of the referenced block. These relative timing offset values are saved in tester memory. These steps are repeated for each reference block in the set. The highest relative offset timing values obtained are used to calibrate the tester timing for both programming a pulse on the signal terminals (known as "driving") and measuring a pulse on the signal terminals (known as "comparing"). A final calibration step is performed to equalize the difference between the relative timing offset for programming a pulse on the reference terminal and for measuring a pulse on the reference terminal. This final calibration step can be performed in at least two different ways.

The invention and its various embodiments are further discussed along with the following figures and the accompanying text.

DETAILED DESCRIPTION

Figure 3:
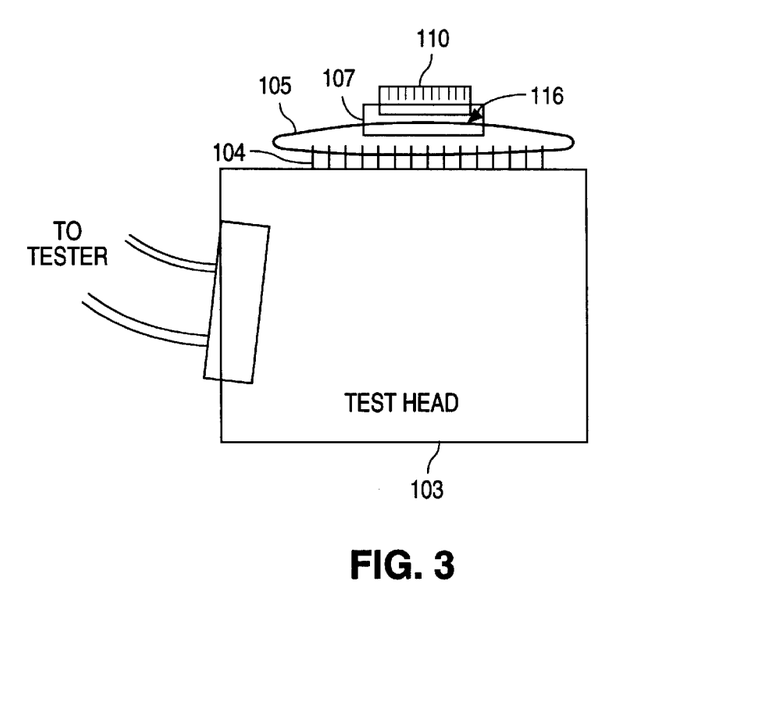
FIG. 3 shows an arrangement according to the present invention.

FIG. 3 is a diagram showing an arrangement of components according to the present invention. The reference block 110 is inserted into a fixture 107. The reference block is essentially a surrogate for the integrated circuit to be tested (DUT) by the tester and has electrical connections to make electrical contact with loadboard 105 through fixture 107 in the same physical locations as would the DUT. Loadboard 105 physically spreads out the electrical signals coming from the reference block 110 and is in turn electrically connected to a test head 103 which electrically interfaces with the conventional ATE tester (not shown). An exemplary tester is the RDX 2200 from Schlumberger Corp., ATE Division. The tester sends signals to the reference block, and can also measure signals coming from the reference block. An advantage conferred by the present invention is that the measuring point 116 for signal arrival is at the fixture level, rather than at the loadboard level. This permits the electrical path length between the loadboard and the fixture to be taken into account to more accurately determine when a signal sent from the tester arrives at the reference block (or alternately, when a signal from the reference block arrives at the tester). Although this electrical path length may not be great in absolute terms, it becomes significant when defining the characteristics of high performance integrated circuits. The reference block 110 is fabricated to have (as nearly as possible given manufacturing constraints), the relevant same dimensions as the integrated circuit (DUT) to ultimately be tested while placed in the fixture. Thus, the apparatus allows the tester to measure itself through a device that is as physically identical to the intended DUT as possible.

Figure 4A:
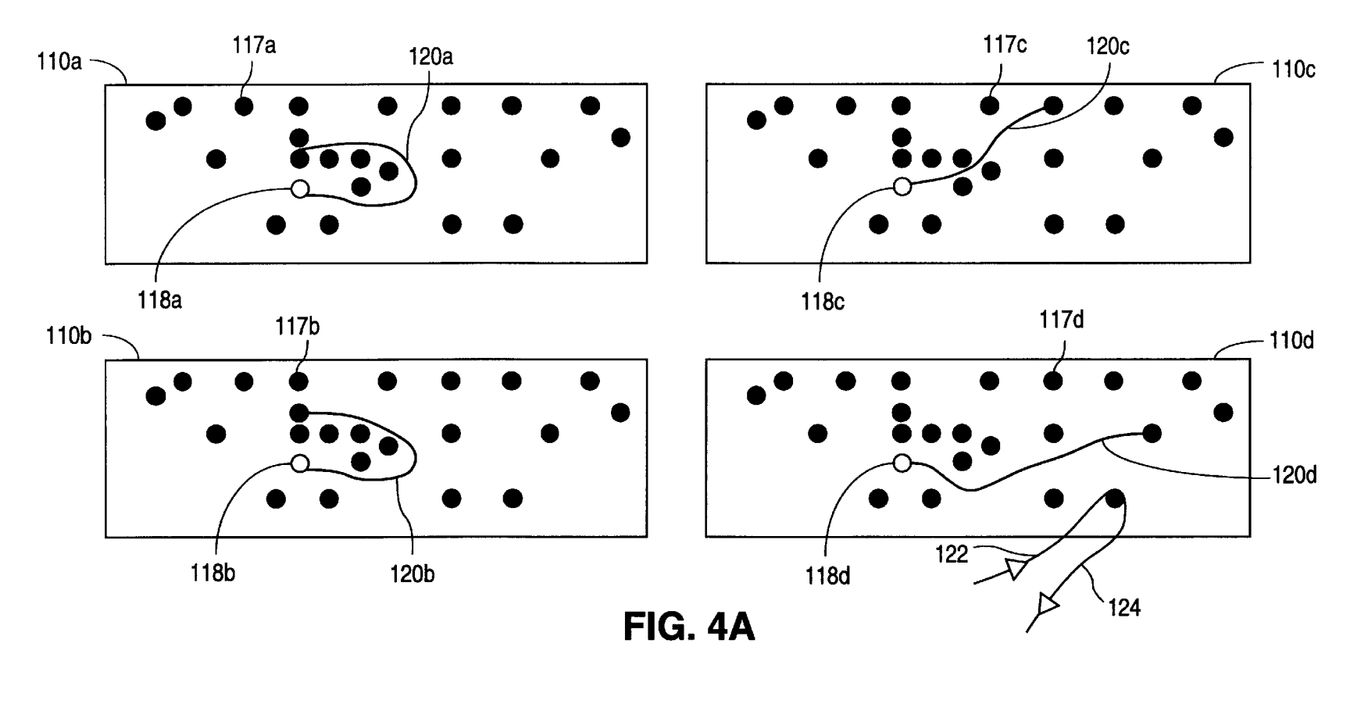
FIG. 4A depicts reference blocks according to the present invention, as viewed from below.

FIG. 4A is a view of reference blocks 110a, 110b, 110c, 110d according to the present invention as seen from below, i.e., as would be seen by the fixture in which each reference block is placed. While four reference blocks 110a, 110b, 110c, 110d are shown, it should be noted that this number is merely for illustrative purposes; the number of reference blocks actually required equals the number of high speed signal terminals on the DUT that must be subjected to timing calibration.

Each of the four reference blocks 110a, 110b, 110c, 110d depicted has several high speed signal terminal locations 117a, 117b, 117c, 117d and a single reference terminal 118a, 118b, 118c, 118d (shown as closed circles and an open circle, respectively, for clarity of presentation). For each reference block, the reference terminal 118a, 118b, 118c, 118d is in the same location. Each reference block in the set has one or more signal terminals and a reference terminal in the same physical locations as the intended DUT. In one embodiment, two tester channels are coupled to each signal terminal on each reference block. A first tester channel 122 supplies a pulse to the signal terminal (driver), while a second tester channel 124 detects pulses from the signal terminal (comparator) (for clarity of presentation, only one signal terminal is shown as being electrically connected to two tester channels). Such a terminal is called a dual transmission line (DTL) terminal. The reference terminal selected should not itself be a terminal requiring accurate timing calibration, because the reference terminal cannot calibrate itself to the same accuracy as the other terminals. Preferably, the common reference terminal selected should not be a DTL terminal. If a DTL terminal is to be calibrated, both driver and comparator must have 50 ohm termination at the ends of their respective transmission lines to eliminate reflections. It is also helpful, but not essential, that the reference terminal selected be centrally located on the reference block, so that signal traces 120a, 120b, 120c, 120d are more easily used. Signal traces 120a, 120b, 120c, 120d are used to electrically connect a unique, single high speed signal terminal on each reference block to the reference terminal on each reference block.

Each signal trace on each reference block should be closely matched both physically and electrically (equivalent for testing purposes) to the signal traces used in the remaining members of the set of reference blocks, so that the electrical path length associated with each signal trace is nearly identical. In one embodiment of the present invention, used in calibrating tester timing for testing of 64/72M-bit Direct Rambus DRAMs, 30 separate reference blocks are required because there are 30 high speed signal terminals on this integrated circuit. The length of the signal traces used is about 10 mm; the variation in length for the entire set of traces is less than 0.5 mm. The impedance of each signal trace in the set is about 50 ohms; the actual resistance of each signal trace is less than 1 ohm. The impedance of the signal trace is determined mostly by the thickness of the associated dielectric layers found on the reference blocks. The reference blocks are made from alternating layers of copper and dielectric material, as on a conventional printed circuit board.

Figure 4B:
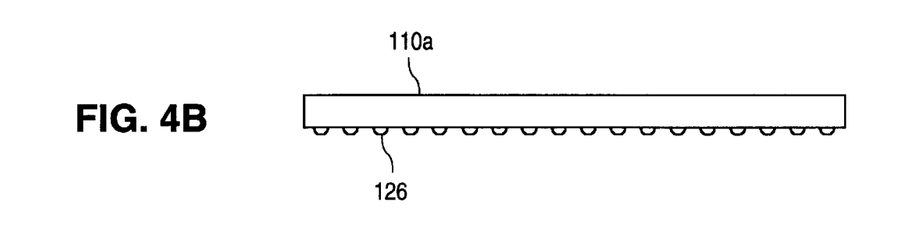
FIG. 4B depicts a reference block according to the present invention, in a side view.

FIG. 4B depicts one of the reference blocks 110a viewed from the side. At the bottom edge of each reference block 110a are contacts 126 for electrical connection between the reference block and the fixture. As stated earlier, the electrical connections on the reference blocks are identical to those on the intended DUT. In the case of Rambus DRAMs, the electrical connection contacts are solder balls, and so solder balls are depicted here for reference block 110a, but this is not limiting. Other electrical connections may be used.

Figure 5A:
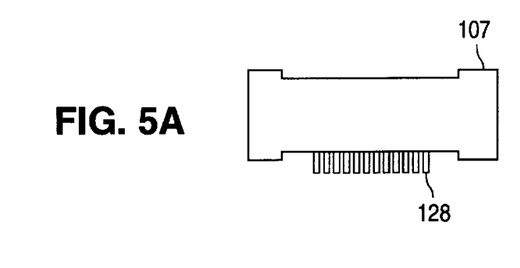
FIGS. 5A and 5B depict two views of a fixture which may be used in practicing the present invention.
Figure 5B:
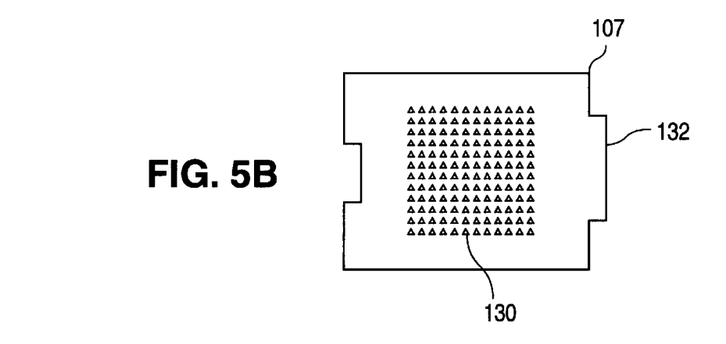

FIGS. 5A and 5B depict in side view and plan view, respectively, a fixture which may be used in the present invention. Typically, a DUT is placed in such a fixture 107 to electrically connect the DUT to a loadboard (not shown), which in turn permits each individual terminal on the DUT to be electrically connected to a tester (not shown). The fixture is also known as a "socket" in the ATE industry. In the present invention, however, a reference block is first placed in the fixture so that timing calibration of the tester may be performed, before testing of the integrated circuits. The fixture 107 has electrical contacts 128 protruding from the bottom to provide electrical connection to the loadboard, and ultimately the tester via the contact through holes 130. The "footprint" 132 of the individual fixture is also shown.

According to the present invention, timing calibration of the tester is performed in the following manner. A set of reference blocks is fabricated, the number of reference blocks in the set being equal to the number of signal terminals on the integrated circuit being subject to the timing calibration. One of the reference blocks from the set is inserted into the fixture. As described earlier, each reference block has a signal trace on it which electrically connects its signal terminal to its reference terminal. The tester then programs a pulse on the signal terminal, and measures the amount of time that elapses until the resulting pulse occurs on the reference terminal, which is on the order of 70 picoseconds. Polarity is then reversed, and the tester programs a pulse on the reference terminal. The tester then measures the amount of time that elapses until the resulting pulse occurs on the signal terminal. These relative timing offset values are saved in tester memory. These steps are repeated for each reference block in the set. The highest relative offset timing values obtained are used to calibrate the tester timing for both programming a pulse on the signal terminals (known as "driving") and measuring a pulse on the signal terminals (known as "comparing"). This may be done in several ways. In one embodiment, the tester has a calibration register and a timing generator. The calibration register adjusts the relative timing offset values to match the highest timing offset value obtained when driving and when comparing. The timing generator then uses these highest timing offset values obtained to adjust the tester timing. A final calibration is performed to equalize the difference between the relative timing offset for programming a pulse on the reference terminal and for measuring a pulse on the reference terminal. The final calibration is discussed in greater detail below, in the discussion of FIG. 6B.

Figure 5C:
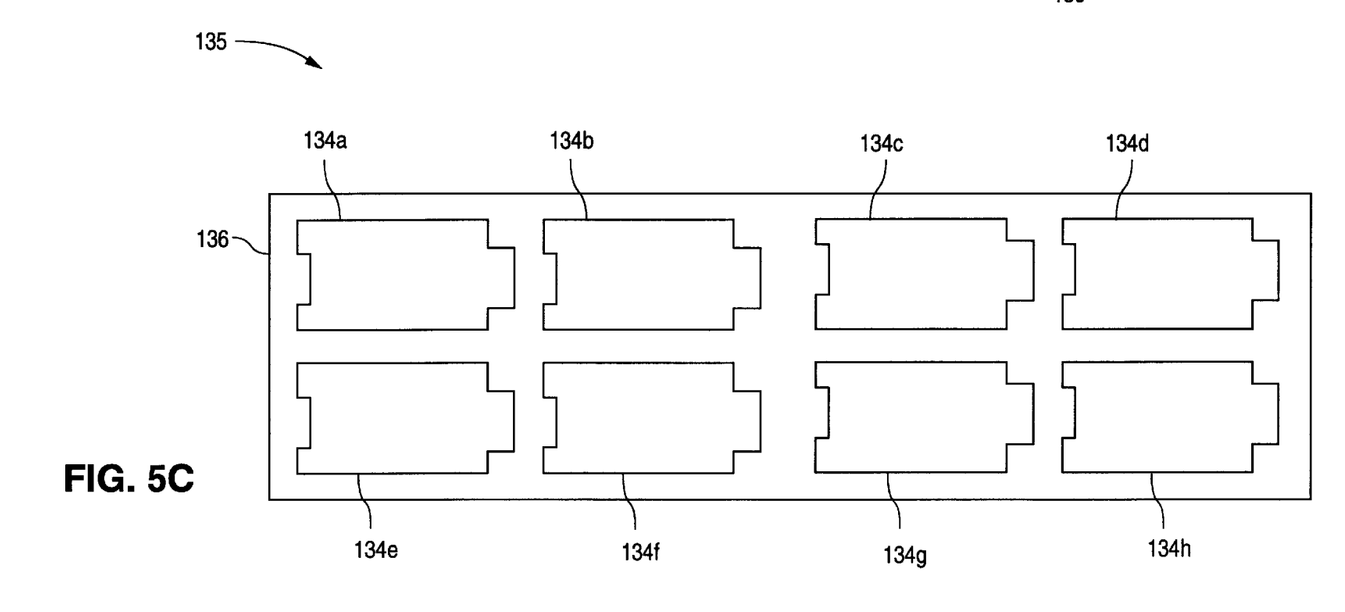
FIG. 5C depicts a multi-site fixture which may be used in practicing the present invention.

FIG. 5C depicts in plan view a multi-site fixture 135 which may be used in accordance with the present invention. The multi-site fixture has several individual fixtures 134a, 134b, 134c, 134d, 134e, 134f, 134g, 134h mounted on a single frame 136. Although an 8-site fixture is shown here, this is not limiting, and any number of fixtures could be mounted on a single frame.

It should be noted that if more than one fixture is to be used at a time, each fixture must be individually calibrated. This is so because each fixture has its own common reference terminal. Although the common reference terminal is in the same location on each socket, each reference terminal has its own calibration values, as is explained in greater detail below. Calibrating tester timing for Rambus DRAMs having 30 high speed signal terminals, using an 8 site fixture, for example, could be done in one of two ways. All 30 reference blocks could be tested through fixture site 1, then fixture site 2, etc., until all 30 reference blocks were tested through all 8 fixture sites. Alternately, 8 copies of the 30 reference block set could be fabricated. Each member of each set having the signal trace between high speed signal terminal #1 and the common reference terminal is tested simultaneously at the 8 fixture sites, then each member of each set having the signal trace between high speed terminal #2 and the common reference terminal is tested simultaneously at the 8 fixture sites, etc., until all of the reference blocks have been tested. The advantage of both of these methods over the prior art is that multiple measurements may be made simultaneously rather than one measurement at a time. Advantageously, an automatic parts handler could be used to insert and remove the multiple reference blocks into the fixtures.

Figure 6A:
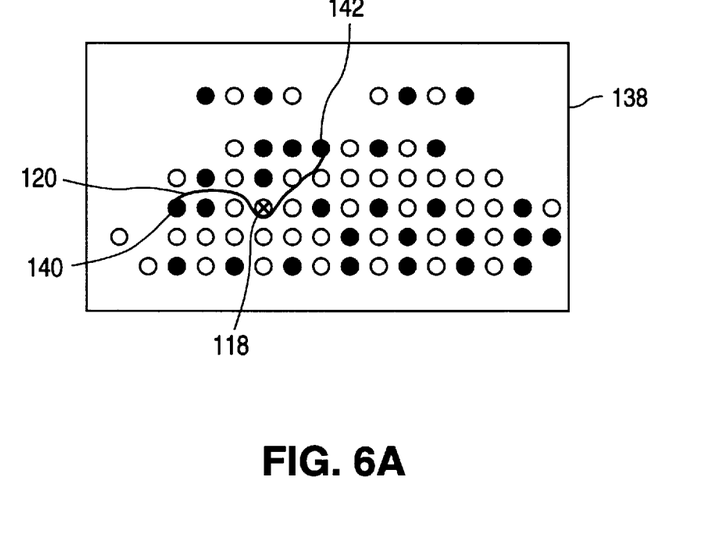
FIG. 6A shows a reference terminal alignment block according to the present invention.

FIG. 6A depicts a reference terminal alignment block 138, as viewed from below. The reference terminal alignment block is an additional reference block used to ensure that the timing offset that occurs while comparing at the reference terminal (programming a pulse on a signal terminal and observing when the resulting pulse is observed at the reference terminal) is made equal to the timing offset that occurs while driving at the reference terminal (programming a pulse on a reference terminal and measuring when the resulting pulse is detected at the same signal terminal). The reference terminal alignment block 138 is different from the set of reference blocks described earlier in that the signal trace 120 electrically connects two high speed signal terminals, a first high speed signal terminal 140 and a second high speed signal terminal 142, to the common reference terminal 118 (here indicated as a circle with an X marked through it, for clarity of presentation). Any two high speed signal terminals on the reference terminal alignment block may be used for this step, but the reference terminal used must always be the same common reference terminal connected to the signal trace on all of the reference blocks in the set.

Figure 6B:
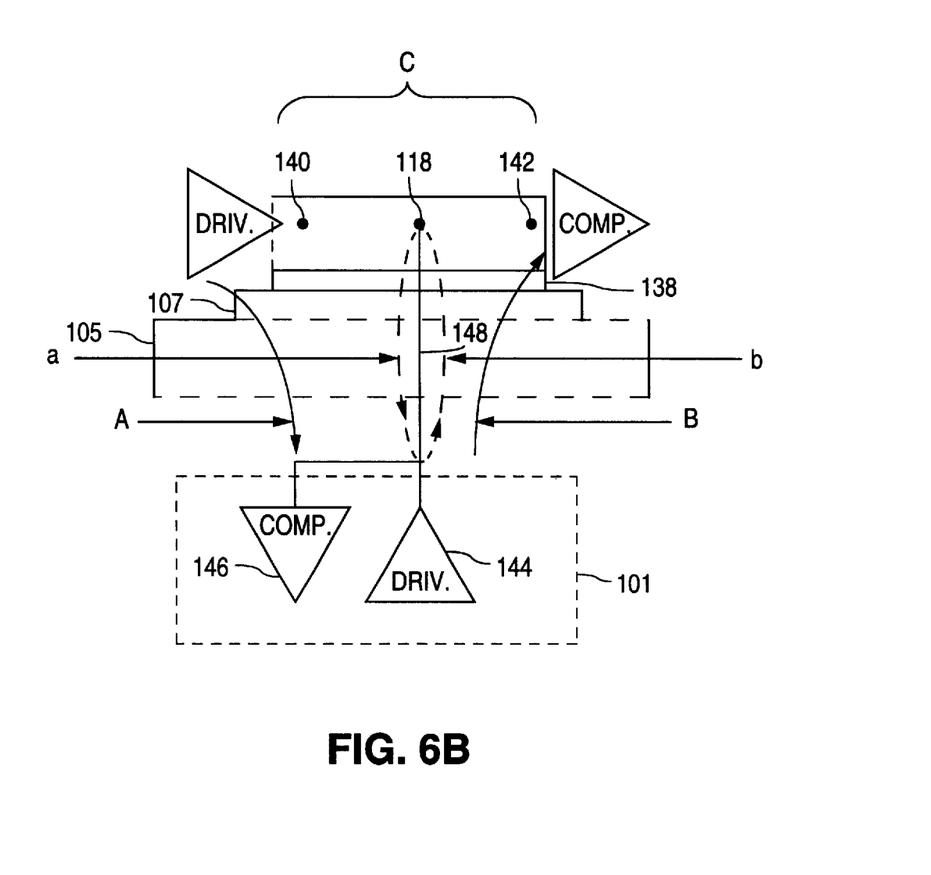
FIG. 6B depicts a side view of the FIG. 6A reference terminal alignment block, while it is in use.

FIG. 6B depicts in a cross-sectional view the reference terminal alignment block 138 while it is in use for equalizing time offsets in the final calibration. The several layers of interconnecting hardware that are typically present between the tester and the DUT are shown with dashed lines. These include tester 101, loadboard 105 and fixture 107. The tester 101 provides both a driver circuit 144 and a comparator circuit 146. A wire 148 connects the driver and comparator circuits to the common reference terminal 118 on the reference terminal alignment block 138. The wire has an electrical path length "a", when the common reference terminal 118 is driving a pulse received from first signal terminal 140, which contributes to relative time delay A observed between driving a pulse at signal terminal 140 and detection of that pulse by the comparator circuit 146; a relative time delay C is also observed between the driving of that same pulse at signal terminal 140 and detection of that pulse at the comparator circuit 142 after it passes by the common reference terminal 118. Similarly, the wire has a different electrical path length "b", when the common reference terminal 118 is receiving a pulse from the tester 101, that is ultimately measured by the comparator at second signal terminal 142, which contributes to time delay B. By setting electrical path lengths a and b equal to each other, the timing offset that occurs while driving with the common reference terminal is made equal to the timing offset that occurs while comparing with the common reference terminal.

According to transmission line theory, $C=(A-a)+(B-b)$ [Eqn. 1]

Setting a equal to b yields: $C=(A-a)+(B-a)$ [Eqn. 2]

Solving for a yields: $a=(A+B-C)/2$ [Eqn. 3]

Assume, for example, that the values of A, B, and C were found to equal 200 ps, 300 ps, and 400 ps, respectively. Then the value for a, according to Equation 3, would be:

$a=(200\ ps+300\ ps-400\ ps)/2=50\ ps,\ or\ 0.050\ ns$

This electrical path length of 50 ps would then be taken into account in final calibration to adjust the tester timing so that it would fire a pulse when it was supposed to. Thus, if signal terminal #1 was instructed to fire a pulse at 1 ns, the tester, taking into account electrical path length a, would actually fire the pulse 0.05 ns earlier, at 0.95 ns. Similarly, if the tester was instructed to measure (compare) a pulse from signal terminal #1 at 1 ns, it would take into account electrical path length "a" and actually measure the pulse 0.05 ns later, at 1.05 ns.

As mentioned above, final calibration requires setting electrical path length a equal to electrical path length b. In practice, there are several ways to carry out this final calibration using the reference terminal alignment block. In the first method, measurements of A and B are made on all of the reference blocks, and stored in a timing calibration look-up table. The values of A, B, and C are then measured on the reference terminal alignment block and the value of electrical path length a is calculated, and then used to adjust all the other reference block measurements stored in the timing calibration look-up table. Thereafter, for each instruction to a signal terminal on a given reference block from the tester, the timing calibration look-up table is consulted and the timing adjusted. In a second method, A, B, and C are measured on the reference terminal alignment block first, then a is calculated and used to calibrate the reference terminal (that is, set electrical path lengths a and b equal to each other, after determining the offset between a and b). Then, A and B can be measured on the remaining reference blocks in the set and used in the timing calibration look-up table without further adjustment. While both methods yield approximately the same tester timing accuracy, the second method may be slightly more accurate under certain conditions. However, it requires a particular reference block (the reference terminal alignment block) to be used first. This is not always possible with an automatic parts handler and so the first method is usually used with automatic handlers.

This disclosure is illustrative and not limiting; further modifications will be apparent to one skilled in the art and are intended to fall within the scope of the appended claims.

We claim:

1. A method of calibrating an integrated circuit tester having a fixture for electrical coupling an integrated circuit to the tester, the fixture having a plurality of electrical connections to the integrated circuit, the method comprising:
    providing a plurality of reference blocks, each reference block fitting in the fixture and having at least two electrical terminals coupled by a trace, wherein the traces on each reference block in the plurality of reference blocks are of about the same electrical path length, and wherein the at least two electrical terminals each electrically contact the fixture;
    inserting one-by-one each of the reference blocks in the fixture;
    propagating a signal from the tester through the trace on each reference block while the reference block is inserted in the fixture;
    measuring a propagation time of the signal for each reference block; and
    calibrating timing of signal propagation of the tester from the measured propagation times.

2. The method of claim 1 further comprising the act of inserting the reference blocks into the fixture using an automated handler.

3. The method of claim 1 further comprising the act of coupling two channels of the tester to each electrical terminal on each reference block, there being a first channel of the tester supplying the signal, and a second channel of the tester detecting the signal.

4. The method of claim 1 in which each trace has an impedance of about 50 ohms, and a length of about 10 mm.

5. The method of claim 1, wherein the calibrating includes:
    determining a relative timing offset of each electrical terminal of the fixture; and
    adjusting each relative timing offset to match the highest determined relative timing offset.

6. The method of claim 1, wherein each of the reference blocks has about the same external dimensions as does the integrated circuit.

7. The method of claim 1, each of the reference blocks having a signal terminal and a reference terminal, the signal terminal being in a different location on each of the reference blocks.

8. A plurality of reference blocks each adapted for insertion into a fixture which is intended to electrically connect an integrated circuit to be tested to a tester, a number of the reference blocks being equal to a number of terminals being subject to testing on the integrated circuit, each reference block having two electrical terminals electrically coupled together by a trace and being in the same relative locations as corresponding electrical terminals of the integrated circuit, and further the electrical terminals on each reference block making electrical contact with the fixture in the same locations as do the corresponding electrical terminals of the integrated circuit.

9. The reference blocks of claim 8, wherein each of the reference blocks has about the same external dimensions as does the integrated circuit.

10. The reference blocks of claim 8, each of the reference blocks having a signal terminal and a reference terminal, the signal terminal being in a different location on each of the reference blocks.

11. A combination comprising:
    a fixture that electrically connects integrated circuits to be tested to a tester; and a plurality of reference blocks each adapted to be inserted into the fixture, each reference block having two electrical terminals corresponding to terminals on an associated integrated circuit to be tested, and further having disposed thereon a trace, the trace electrically connecting the two electrical terminals on each reference block, wherein the trace is equivalent physically and electrically to traces on others of the plurality of reference blocks.

12. The combination of claim 11, wherein each of the plurality of blocks has about the same external dimensions as does the integrated circuit.

13. The combination of claim 11, each of the reference blocks having a signal terminal and a reference terminal, the signal terminal being in a different location on each of the reference blocks.

* * * * *